US009558943B1

(12) United States Patent
Pawlak

(10) Patent No.: US 9,558,943 B1
(45) Date of Patent: Jan. 31, 2017

(54) STRESS RELAXED BUFFER LAYER ON TEXTURED SILICON SURFACE

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/797,531

(22) Filed: Jul. 13, 2015

(51) Int. Cl.
*H01L 21/02* (2006.01)
*H01L 21/321* (2006.01)
*H01L 29/06* (2006.01)
*H01L 29/201* (2006.01)
*H01L 29/161* (2006.01)

(52) U.S. Cl.
CPC ..... *H01L 21/0265* (2013.01); *H01L 21/02538* (2013.01); *H01L 21/02645* (2013.01); *H01L 21/3212* (2013.01); *H01L 29/0657* (2013.01); *H01L 29/161* (2013.01); *H01L 29/201* (2013.01)

(58) Field of Classification Search
CPC .... H01L 21/0265; H01L 29/201; H01L 29/20; H01L 29/161; H01L 29/0657; H01L 29/0665; H01L 21/02538; H01L 21/02645; H01L 21/02647; H01L 21/32115; H01L 21/3212
See application file for complete search history.

(56) References Cited

U.S. PATENT DOCUMENTS

2002/0069816 A1* 6/2002 Gehrke .................. C30B 25/02
117/84
2004/0123796 A1* 7/2004 Nagai .................... C30B 25/02
117/103
2013/0228797 A1* 9/2013 Nagasawa ......... H01L 21/02381
257/77
2013/0313567 A1* 11/2013 Furuya .................. C30B 29/406
257/76
2014/0054605 A1* 2/2014 Iwai ...................... H01L 33/007
257/76
2014/0124810 A1* 5/2014 Kim ...................... H01L 33/007
257/98

OTHER PUBLICATIONS

Goh, W.H. "Structurual and optical properties of nanodots, nanowires, and multi-quantum wells of III-nitride grown by MOVPE nano-selective area growth" Journ. of Crystal Growth vol. 315, Iss. 1, Jan. 15, 2011 pp. 160-163.*
Huaiyue, Y. "Chemical Mechanical polishing of freestanding GaN substrates" Jour. of Semi. vol. 30, No. 2 Feb. 2009 pp. 023003-1 through 023003-4.*
Taiwan Office Action for related Taiwan Patent Application No. 105106271 dated Oct. 4, 2016, 11 Pages.

* cited by examiner

*Primary Examiner* — Matthew Landau
*Assistant Examiner* — Grant Withers
(74) *Attorney, Agent, or Firm* — Ditthavong & Steiner, P.C.

(57) ABSTRACT

A method of forming a stress relaxed buffer layer (SRB) on a textured or grooved silicon (Si) surface and the resulting device are provided. Embodiments include forming a textured surface in an upper surface of a Si wafer; epitaxially growing a low-temperature seed layer on the textured surface of the Si wafer; depositing a SRB layer over the low-temperature seed layer; and planarizing an upper surface of the SRB layer.

12 Claims, 6 Drawing Sheets

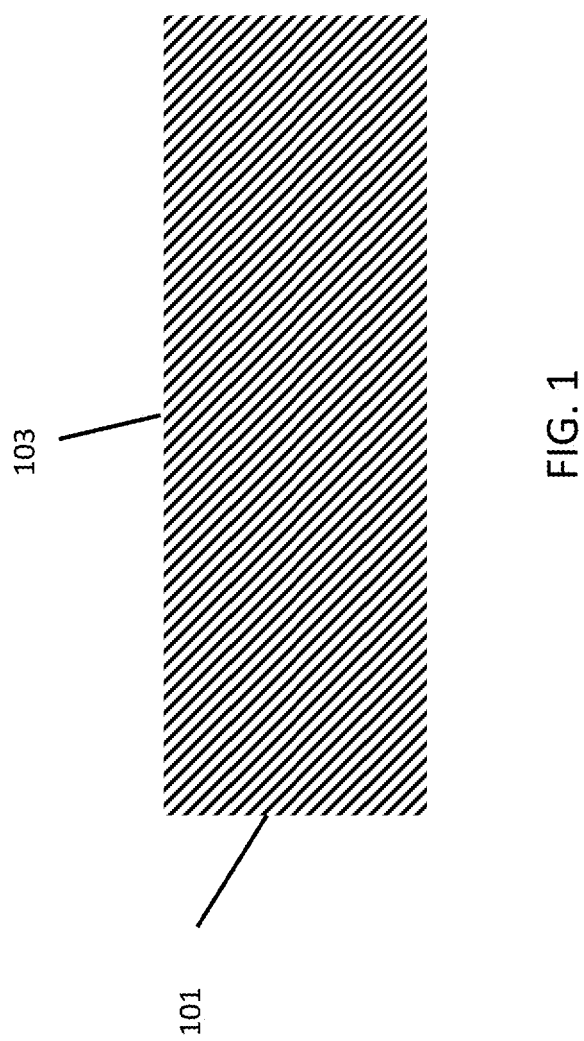

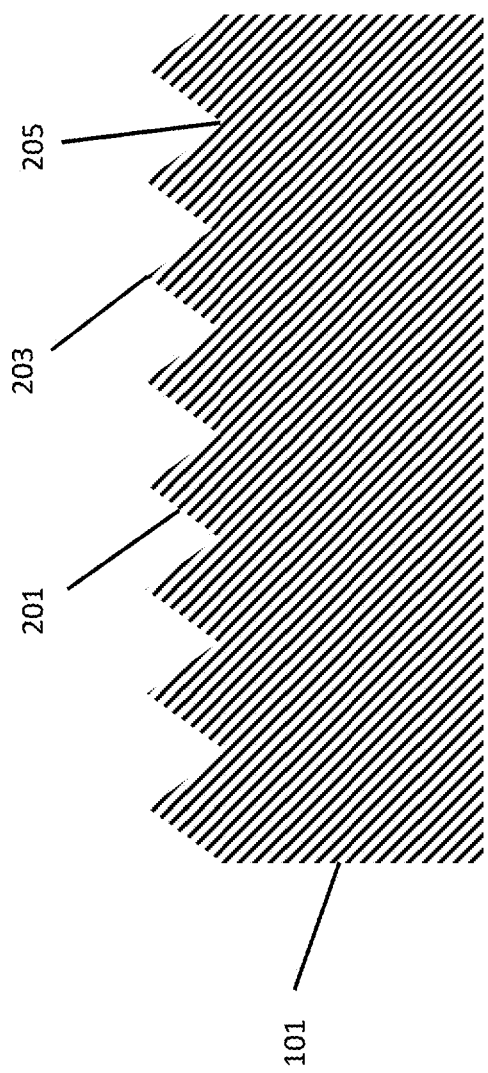

STRESS RELAXED BUFFER LAYER ON TEXTURED SILICON SURFACE

TECHNICAL FIELD

The present disclosure relates to the manufacture of semiconductor devices. In particular, the present disclosure relates to a stress relaxed buffer (SRB) layer used in manufacturing a semiconductor device in the 14 nm, 10 nm, 7 nm, 5 nm, and 3 nm technology nodes.

BACKGROUND

With silicon (Si) wafers, epitaxial growth of different semiconductor materials having different lattice constants and thermal coefficients results in the generation of defects, such as dislocation defects which in turn lead to poor transistor performance and reliability issues. Substrates with SRB layers, including gallium arsenide (GaAs) or silicon germanium (SiGe) stepped or graded, are useful in achieving stress relaxation. However, the SRB layers are thick (e.g., ranging between 2 µm to 2.5 µm) and therefore expensive. Further, if an intermediate chemical mechanical polishing (CMP) step is used to planarize the layer and smoothen the surface roughness, there is a risk of having oxide residues on top before next epi step. Dielectric residues would than degrade the quality of the top epi layer.

A need therefore exists for methodology enabling the application of a thin SRB layer which achieves complete stress relaxation and locally confines defects at the bottom of trenches on a textured Si surface and the resulting device.

SUMMARY

An aspect of the present disclosure includes texturing or grooving an upper surface of a Si wafer, epitaxially growing a low-temperature seed layer on the textured or grooved surface of the Si wafer, and depositing (epi-growing) a SRB layer over the seed layer. Defects can be locally confined or trapped to within 10 nm of seed epi thickness on a textured Si surface.

Another aspect of the present disclosure is a device including a textured upper surface of a Si wafer, an epitaxially grown low-temperature seed layer on the textured surface of the Si wafer, and a SRB layer over the seed layer.

Additional aspects of the present disclosure include providing <111> surface within 'V-groove' recessed trench and growing low temperature thin epi-seed layer leads to efficient defect confinement and sufficient lattice parameter relaxation. The subsequent SRB layer is sufficiently defect-free and thin to provide good quality epi prior epi growth of the channel material. A <111> surface is created by means of wafer texturing or grooving.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a textured surface or V-grooved surface in an upper surface of a Si wafer; epitaxially growing a low-temperature seed layer on the textured surface of the Si wafer; depositing a SRB layer over the low-temperature seed layer; and planarizing an upper surface of the SRB layer.

Aspects of the present disclosure include planarizing the upper surface of the SRB layer with CMP. Other aspects include epitaxially growing the low-temperature seed layer in trenches of the textured surface of the Si wafer. Further aspects include epitaxially growing the low-temperature seed layer to a thickness of 10 nm to 40 nm. Additional aspects include the pyramids having a depth of less than 200 nm. Other aspects include the low-temperature seed layer including germanium (Ge), indium phosphide (InP), or gallium arsenide (GaAs). Further aspects include epi growth of the SRB layer over the low-temperature seed layer at a thickness of 200 to 300 nm, wherein the SRB layer includes silicon germanium (SiGe), indium gallium arsenide (InGaAs), or indium gallium arsenide phosphide ($Ga_xIn_{1-x}As_yP_{1-y}$). Additional aspects include forming the textured surface on the upper surface of the Si wafer including forming pyramids in the upper surface of the Si wafer by etching, wherein the pyramids have a height less than 200 nm. Another aspect includes the pyramids having a Si <111> surface. Additional aspects include parallel V-grooves on top of the wafer.

Another aspect of the present disclosure is a method including: forming a textured surface in an upper surface of a Si wafer, wherein the textured surface includes a Si <111> surface; epitaxially growing a low-temperature seed layer on the textured surface of the Si wafer, the low-temperature seed layer including Ge, InP, or GaAs; epi-growing a SRB layer over the low-temperature seed layer at a thickness of 200 to 300 nm, wherein the SRB layer includes SiGe, InGaAs, or $Ga_xIn_{1-x}As_yP_{1-y}$; and planarizing an upper surface of the SRB layer.

Aspects include epitaxially growing the low-temperature seed layer to a thickness of 10 nm to 40 nm. Further aspects include planarizing the upper surface of the SRB layer with CMP. Additional aspects include forming the textured surface on the upper surface of the Si wafer by forming pyramids or V-grooves in the upper surface of the Si wafer.

Another aspect of the present disclosure is a device including a Si wafer including a textured upper surface; an epitaxially grown low-temperature seed layer deposited on the textured surface of the Si wafer; and a SRB layer deposited over the low-temperature seed layer. Aspects include the epitaxially grown the low-temperature seed layer having a thickness of 10 nm to 40 nm. Further aspects include the textured surface of the Si wafer including pyramids having a Si <111> surface, or V-grooves having a Si <111> surfaces. Other aspects include the low-temperature seed layer including Ge, InP, or GaAs. Additional aspects include the SRB layer including SiGe, InGaAs, or $Ga_xIn_{1-x}As_yP_{1-y}$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accom- FIGS. 1, 2A, 4 and 5 schematically illustrate cross sectional views of a process flow to produce a SRB layer on a textured Si wafer, in accordance with an exemplary embodiment.

DETAILED DESCRIPTION

Figure 2B:
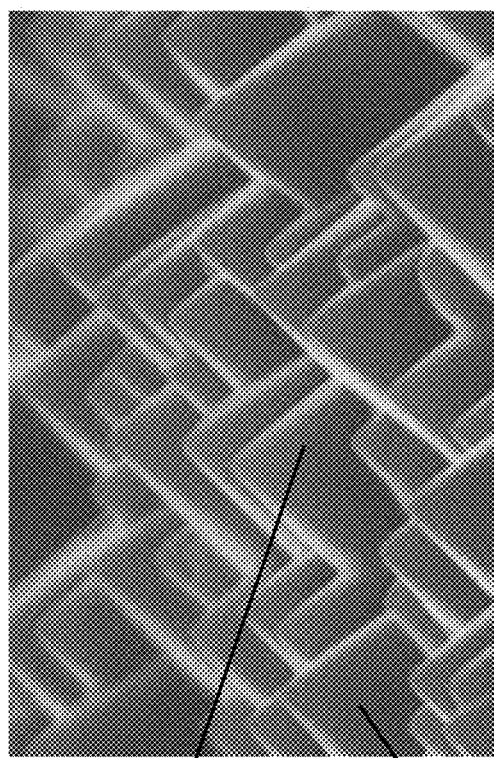
FIG. 2B is a scanning electron microscope image of a textured Si wafer surface.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problem of dislocation defects generated when growing semiconductor materials, such as SRB layers, on Si wafers.

Methodology in accordance with embodiments of the present disclosure includes forming a textured or grooved surface in an upper surface of a Si wafer; epitaxially growing a low-temperature seed layer on the textured surface of the Si wafer; depositing a SRB layer over the low-temperature seed layer; and planarizing an upper surface of the SRB layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 1 illustrates, in cross section, an example of Si wafer 101 having a smooth upper surface 103. The Si wafer can have a variety of diameters from 25.4 mm to 450 mm and can be formed of a crystalline Si. The Si wafer serves as a substrate for microelectronic devices built in and over the wafer and undergoes many microfabrication process steps such as doping or ion implantation, etching, deposition of various materials, and photolithographic patterning.

Adverting to FIG. 2A, the Si wafer 101 is textured to form a plurality of pyramid shapes 201 on the upper surface 103 of the Si wafer. The pyramid shapes 201 have a peak 203 and a trench 205. The height of each pyramid shape 201 from its peak 203 to the bottom of trench 205 is between 100 nm to 200 nm. The textured surface of the Si wafer 101 is formed on one side of the Si wafer 101 by etching processes including dry or wet etching processes or a combination of wet/dry processes to form the pyramid shapes 201. A dry etch process such as a sulfur hexafluoride based dry etch can be used to produce the irregularities on the surface of the Si wafer 101. The entire upper surface of Si wafer 101 can be etched to provide the fine pyramid shapes 201 ranging in height between 100 to 200 nm. The pyramids 201 have a Si <111> surface. A wet etch process can also be used to form pyramid shapes 201 less than 200 nm in height. An aqueous solution of tetramethylammonium hydroxide (TMAH), potassium hydroxide (KOH) or sodium hydroxide (NaOH) can be used as a wet etching solution.

Figure 2C:
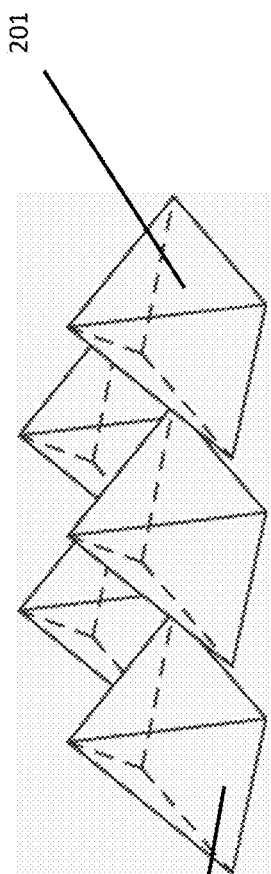
FIG. 2C is a drawing of pyramid shapes formed in surface of Si wafer.

In FIG. 2B, is a scanning electron microscope image of a textured Si wafer 101 showing the plurality of pyramid shapes 201. In FIG. 2C, is a drawing representing a portion of the randomly formed pyramids 201 in the image of FIG. 2B.

Figure 3:
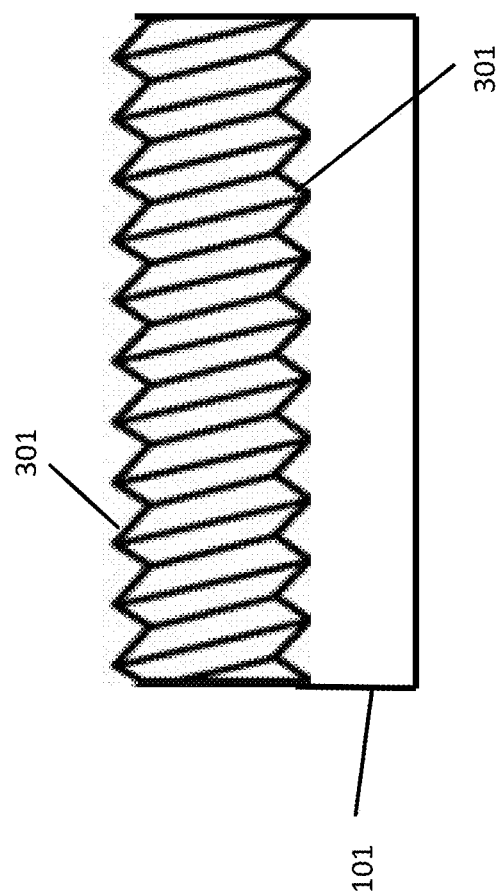
FIG. 3 is a perspective view of an Si wafer surface having V-grooved trenches formed.

As an alternative to the pyramid shapes 201 formed on the Si wafer 101, a masking and orientation selective V-groove etching can be performed on the Si wafer 101. As a result of this processing, long and parallel V-groove trenches 301 are formed across the Si wafer 101, as illustrated in FIG. 3.

Figure 4:
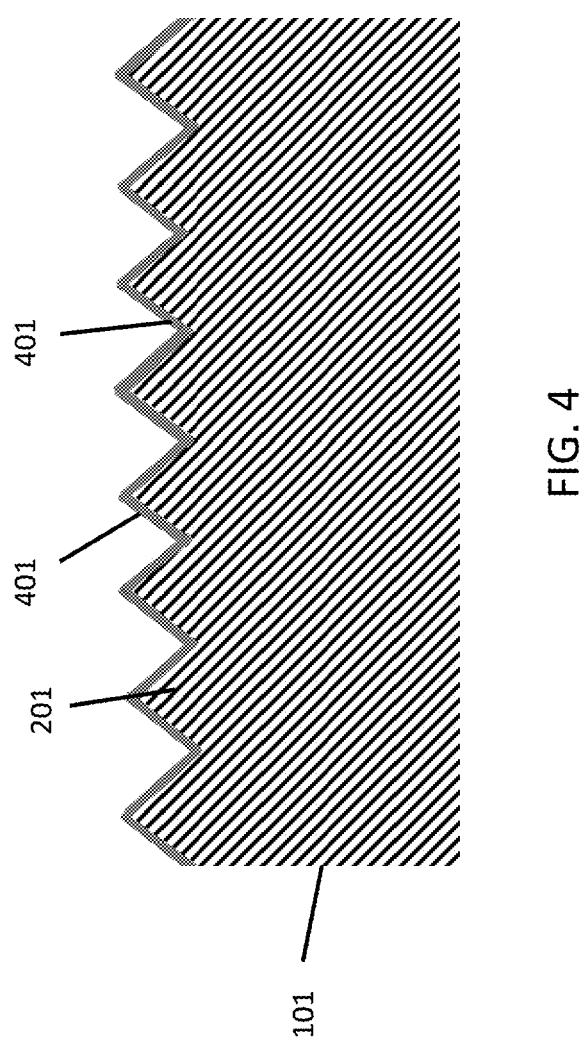

Adverting to FIG. 4, an epitaxially grown low-temperature seed layer 401 is formed on the textured surface of the Si wafer 101. In particular, the low-temperature seed layer 401 is formed over the pyramid shapes 201 such that the peaks 203 and trenches 205 are covered with the epitaxially grown low-temperature seed layer 401. The low-temperature seed layer 401 is grown to a thickness of 10 to 40 nm, for example 20 nm. The low-temperature seed layer includes typically Ge, InP, or GaAs. The temperature at which the seed layer 401 is epitaxially grown ranges between 400 and 700° C. A chemical vapor deposition (CVD) or molecular beam epitaxy (MBE) processes can be used to epitaxially grow the seed layer 401.

Figure 5:
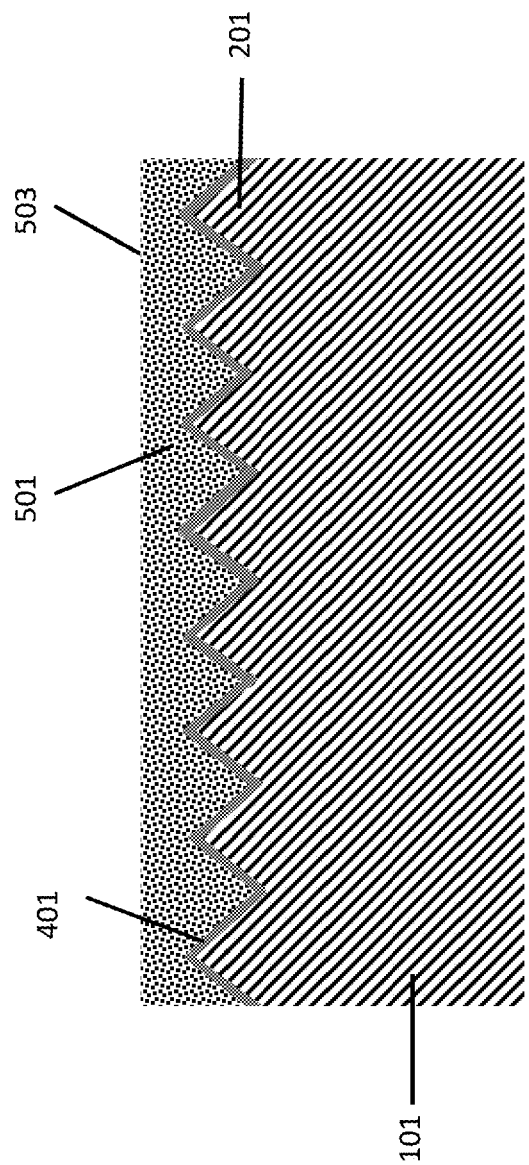

Adverting to FIG. 5, a SRB layer 501 is deposited over the low-temperature seed layer 401. The upper surface 503 of SRB layer 501 is shown planarized. Planarization can be performed with CMP. The SRB layer 501 is formed over the low-temperature seed layer 401 at a thickness of 200 to 500 nm. The SRB layer 501 includes a high mobility channel material including Ge, $Si_xGe_{1-x}$, InGaAs, or $Ga_xIn_{1-x}As_yP_{1-y}$. Following the planarization of the SRB layer 501, the silicon wafer 101 can be further processed such as adding channels. The pyramids 201 can be detected by cross-sectional transmission electron microscopy (X-TEM).

The embodiments of the present disclosure can achieve several technical effects, such as a quick formation of a fully relaxed SRB layer. The present invention allows for the formation of the SRB layer with a low cost process.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using Si wafers having a thin SRB layer which achieves complete stress relaxation and locally confines defects at the bottom of trenches on a textured Si surface. The present disclosure is particularly applicable to the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a textured or V-grooved surface in an upper surface of a silicon (Si) wafer, wherein the step of forming the textured or V-grooved surface on the upper surface of the Si wafer includes:
      forming pyramids in the upper surface of the Si wafer by etching, wherein the pyramids have a height less than 300 nm and a Si <111> surface;
   epitaxially growing a low-temperature seed layer on the textured surface of the Si wafer;
   depositing a stress relaxed buffer (SRB) layer over the low-temperature seed layer; and
   planarizing an upper surface of the SRB layer.

2. The method according to claim 1, wherein the planarizing comprises:
   planarizing the upper surface of the SRB layer with chemical-mechanical planarization (CMP).

3. The method according to claim 1, further comprising:
   epitaxially growing the low-temperature seed layer in trenches of the textured or V-grooved surface of the Si wafer.

4. The method according to claim 3, further comprising:
   epitaxially growing the low-temperature seed layer to a thickness of 10 nm to 40 nm.

5. The method according to claim 3, wherein the pyramids have a depth of less than 200 nm.

6. The method according to claim 1, wherein the low-temperature seed layer comprises germanium (Ge), indium phosphide (InP), or gallium arsenide (GaAs).

7. The method according to claim 1, further comprising:
   epitaxially growing the SRB layer over the low-temperature seed layer at a thickness of 200-500 nm,
   wherein the SRB layer includes silicon germanium ($Si_xGe_{1-x}$), indium gallium arsenide (InGaAs), or indium gallium arsenide phosphide ($Ga_xIn_{1-x}As_yP_{1-y}$).

8. The method according to claim 1, wherein the step of forming the textured or V-grooved surface on the upper surface of the Si wafer includes:
   forming parallel V-grooves in the upper surface of the Si wafer.

9. A method comprising:
   forming a textured surface in an upper surface of a Si wafer, wherein the textured surface includes a Si <111> surface;
   epitaxially growing a low-temperature seed layer on the textured surface of the Si wafer, the low-temperature seed layer comprising Ge, InP, or GaAs;
   epitaxially growing a SRB layer over the low-temperature seed layer at a thickness of 200-300 nm, wherein the SRB layer comprises SiGe, $In_xGa_{1-x}As$, or $Ga_xIn_{1-x}As_yP_{1-y}$; and
   planarizing an upper surface of the SRB layer.

10. The method according to claim 9, further comprising:
    epitaxially growing the low-temperature seed layer to a thickness of 10 nm to 40 nm.

11. The method according to claim 9, wherein the planarizing comprises:
    planarizing the upper surface of the SRB layer with CMP.

12. The method according to claim 9, wherein the step of forming the textured surface on the upper surface of the Si wafer includes:
    forming pyramids or parallel V-grooves in the upper surface of the Si wafer.

* * * * *